US009553586B2

(12) United States Patent
Genoe et al.

(10) Patent No.: US 9,553,586 B2
(45) Date of Patent: Jan. 24, 2017

(54) FILED PROGRAMMABLE GATE ARRAY DEVICE WITH PROGRAMMABLE INTERCONNECT IN BACK END OF LINE PORTION OF THE DEVICE

(71) Applicant: IMEC VZW, Leuven (BE)

(72) Inventors: Jan Genoe, Messelbroek (BE); Soeren Steudel, Leuven (BE); Zsolt Tokei, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/565,316

(22) Filed: Dec. 9, 2014

(65) Prior Publication Data

US 2015/0162913 A1 Jun. 11, 2015

(30) Foreign Application Priority Data

Dec. 10, 2013 (EP) ..................... 13196407

(51) Int. Cl.
| | |
|---|---|
| *H03K 19/0185* | (2006.01) |
| *H03K 17/693* | (2006.01) |
| *G06F 9/455* | (2006.01) |
| *H03K 19/177* | (2006.01) |
| *H01L 27/06* | (2006.01) |
| *H01L 27/108* | (2006.01) |

(52) U.S. Cl.
CPC ... *H03K 19/018585* (2013.01); *H01L 27/0688* (2013.01); *H03K 19/1776* (2013.01); *H03K 19/17796* (2013.01); *H01L 27/10873* (2013.01)

(58) Field of Classification Search
None
See application file for complete search history.

(56) References Cited

U.S. PATENT DOCUMENTS 5,644,496 A * 7/1997 Agrawal ............ H03K 19/1737
326/38
6,144,225 A * 11/2000 Lesea ................. H01L 23/5222
257/E23.144

(Continued)

OTHER PUBLICATIONS

Lee et al., Low-Temperature-Grown Transition Metal Oxide Based Storage Materials and Oxide Transistors for High Density Non-volatile Memory, Dec. 4, 2008, Advanced Functional Materials, 19, 1587-1593.*

(Continued)

*Primary Examiner* — Crystal L Hammond
(74) *Attorney, Agent, or Firm* — Knobbe Martens Olson & Bear, LLP

(57) ABSTRACT

A Field-Programmable Gate Array device is provided with programmable interconnect points in the form of interconnect circuits comprising one or more pass transistors, wherein at least some components of the interconnect circuits are implemented in the Back-End-Of-Line part of the Field-Programmable Gate Array device's production process. The memory element in an interconnect point is not produced as a Static Random Access Memory cell, but as a Dynamic Random Access Memory cell, requiring only a single select transistor and a storage capacitor for each memory element. The fabrication of at least the select transistor and the pass transistor involves the use of a thin film semiconductor layer, e.g., Indium Gallium Zinc Oxide, enabling production of transistors with low leakage in the Back-End-Of-Line.

8 Claims, 5 Drawing Sheets

(56) References Cited

U.S. PATENT DOCUMENTS

| | | | | |
|---|---|---|---|---|
| 7,635,843 | B1* | 12/2009 | Luo et al. | 250/307 |
| 8,000,519 | B1* | 8/2011 | Zheng et al. | 382/145 |
| 8,441,038 | B1* | 5/2013 | Trimberger | 257/209 |
| 8,569,160 | B2* | 10/2013 | Rinerson et al. | 438/598 |
| 8,712,718 | B1* | 4/2014 | Camarota et al. | 702/117 |
| 8,890,562 | B1* | 11/2014 | Hartanto | 324/762.06 |
| 2002/0053694 | A1* | 5/2002 | Sutcliffe | G11C 29/40 |
| | | | | 257/326 |
| 2005/0091630 | A1* | 4/2005 | Madurawe | H03K 19/17704 |
| | | | | 326/38 |
| 2005/0121789 | A1* | 6/2005 | Madurawe | H01L 27/0207 |
| | | | | 257/758 |
| 2008/0248649 | A1* | 10/2008 | Adetutu | H01L 21/02164 |
| | | | | 438/692 |
| 2010/0157644 | A1* | 6/2010 | Norman | 365/51 |
| 2010/0195363 | A1* | 8/2010 | Norman | G11C 5/02 |
| | | | | 365/51 |
| 2012/0314477 | A1* | 12/2012 | Siau | G11C 8/08 |
| | | | | 365/148 |
| 2013/0069052 | A1* | 3/2013 | Sandhu | H01L 21/8254 |
| | | | | 257/43 |
| 2013/0294136 | A1* | 11/2013 | Siau et al. | 365/66 |
| 2014/0103471 | A1* | 4/2014 | Lupino | H01L 27/224 |
| | | | | 257/421 |

OTHER PUBLICATIONS

Kaneko et al., "Operation of Functional Circuit Elements using BEOL-Transistor with InGaZnO Channel for On-chip High/Low Voltage Bridging I/Os and High-Current Switches" 2012 Symposium on VLSI Technology Digest of Technical Papers, pp. 123-124, 978-1-4673-0847-2/12/$31.00 © 2012 IEEE.

* cited by examiner

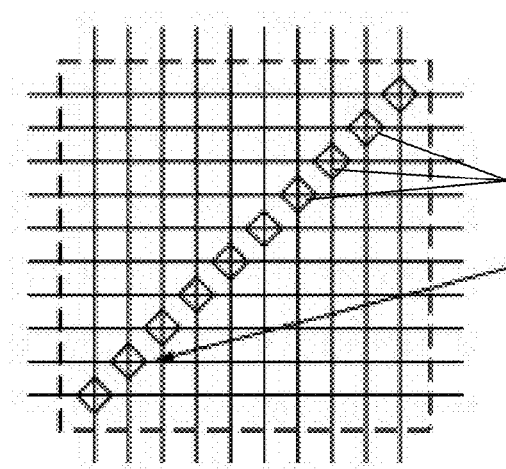
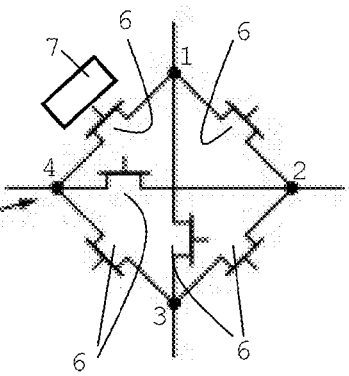
FIG. 1A
FIG. 1B
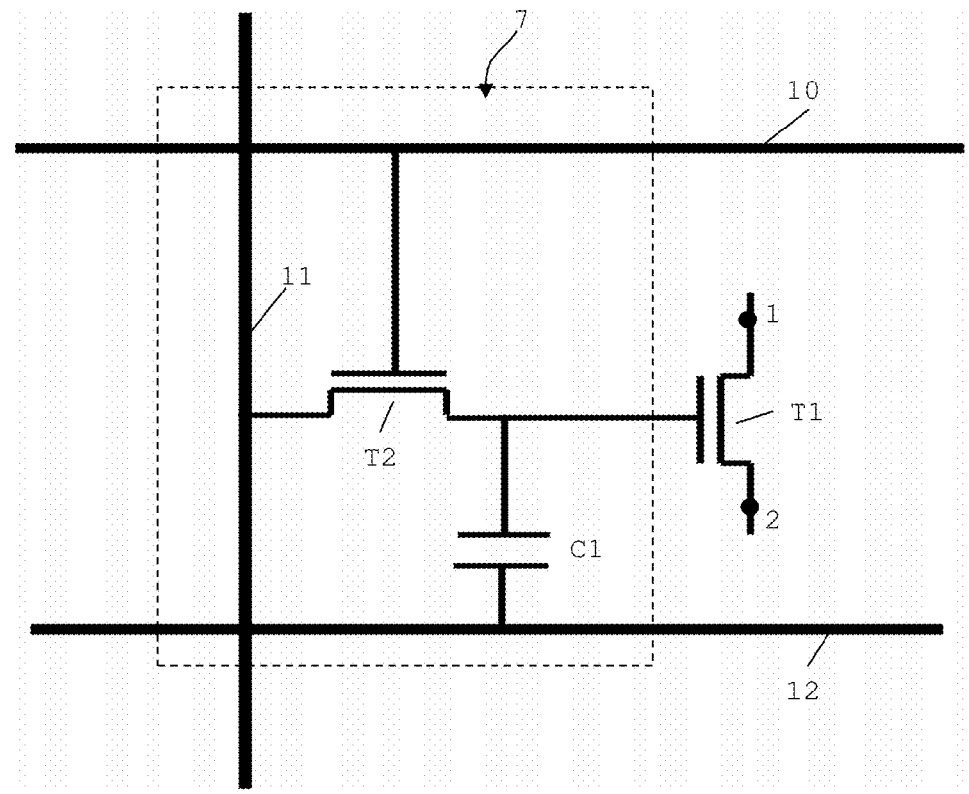
FIG. 2

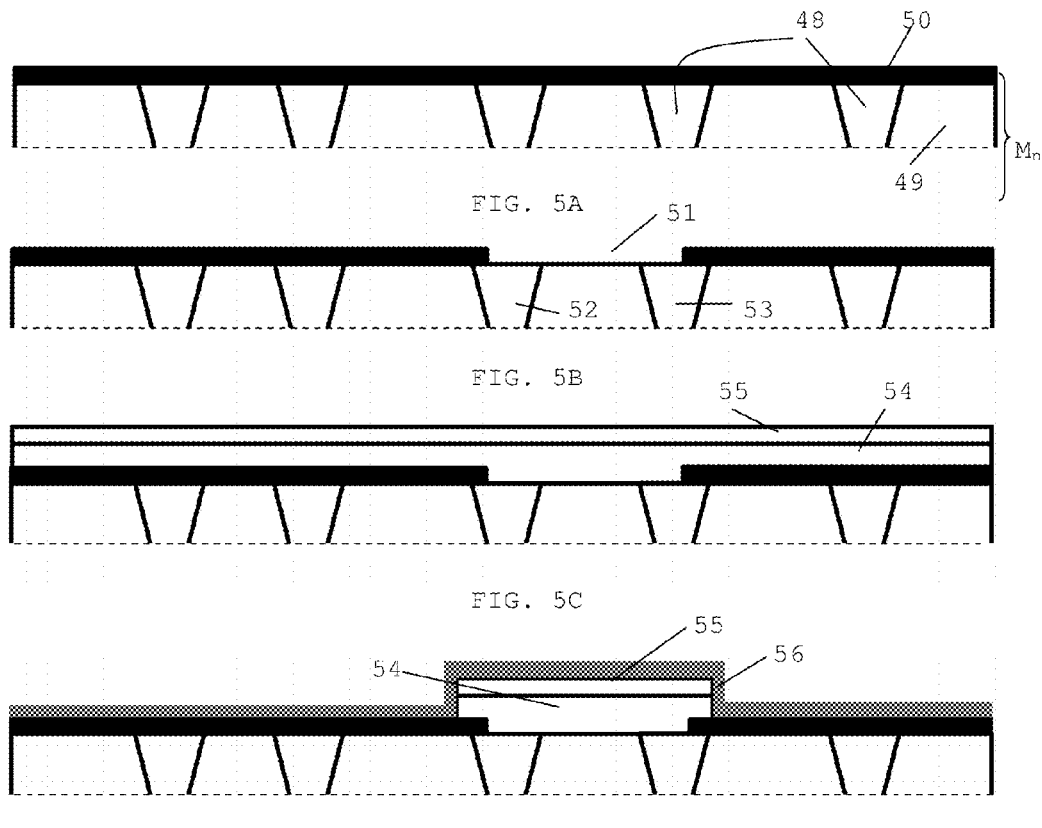
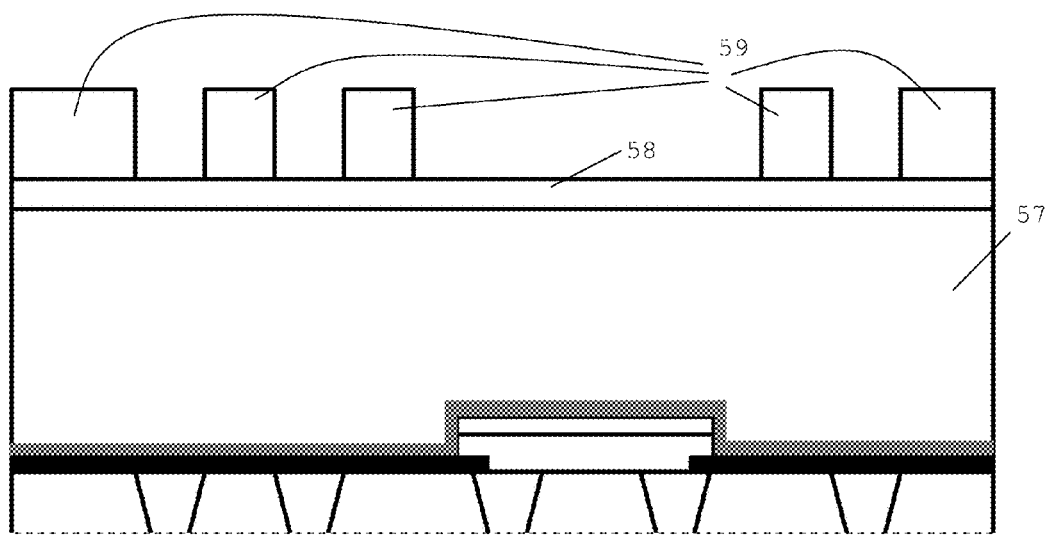

FILED PROGRAMMABLE GATE ARRAY DEVICE WITH PROGRAMMABLE INTERCONNECT IN BACK END OF LINE PORTION OF THE DEVICE

INCORPORATION BY REFERENCE TO RELATED APPLICATIONS

Any and all priority claims identified in the Application Data Sheet, or any correction thereto, are hereby incorporated by reference under 37 CFR 1.57. This application claims foreign priority to European Patent Application No. EP 13196407.4 filed Dec. 10, 2013. The aforementioned application is incorporated by reference herein in its entirety, and is hereby expressly made a part of this specification.

BACKGROUND OF THE INVENTION

Field of the Invention

Integrated circuit devices known as Field-Programmable Gate Array (FPGA) devices are provided.

Description of the Related Technology

FPGAs are Integrated Circuit (IC) devices comprising a large number of logic blocks and input/output blocks, interconnected through a network of programmable interconnects, so that a high degree of flexibility is obtained in terms of the functionality of the device. Interconnect routing, through the programmable interconnects, is typically realized in the Front-End-Of-Line (FEOL) part of the FPGA's production process, which is the part wherein the FPGA's logic blocks are created on a semiconductor substrate. As each programmable interconnect circuit of a typical routing matrix typically requires a circuit of up to six pass transistors (see hereafter), each pass transistor being equipped with its own Static Random Access Memory (SRAM) cell, with each SRAM cell itself typically comprising 6 transistors, it is clear that the interconnect routing consumes a large area on the semiconductor surface.

FIG. 1A shows a typical routing matrix, each horizontal and vertical line representing a signal path within the FPGA, running between I/O blocks and/or logic blocks on the device. At a number of the crossings between a horizontal and vertical line, a programmable interconnect circuit 5 is present. A detail of each of the interconnect circuits 5 is shown in FIG. 1B. Each interconnect circuit comprises six pass transistors 6 whose state determines whether or not signals are "pass"-ed (=switched) from each of the connection points 1-2-3-4 to the other connection points. Each pass transistor is associated with a memory element 7 in the form of an SRAM cell (only one SRAM cell is shown), the SRAM cell being a memory element for storing the on-or-off state of the associated pass transistor. Each SRAM cell comprises 6 transistors. This yields 42 FEOL transistors per interconnect point or 2100 transistors for a 50 by 50 interconnect matrix of the type shown in FIG. 1. Some interconnect circuits do not enable signals to be "pass"-ed or routed in all six directions between the connection points, so that less than 6 pass transistors are needed. However, the majority of interconnect circuits in an FPGA does contain the 6 pass transistors, each provided with an SRAM cell. The SRAM cells and the pass transistors are produced in the FEOL, which represents a large surface area on the chip, i.e. an inefficient use of the semiconductor surface.

SUMMARY OF CERTAIN INVENTIVE ASPECTS

A Field Programmable Gate Array device is provided comprising a Front-End-Of-Line (FEOL) portion and a Back-End-Of-Line (BEOL) portion, the BEOL portion comprising a plurality of metallization layers, the FEOL portion comprising a plurality of logic blocks, the FPGA further comprising programmable interconnect points for defining signal routing between the logic blocks and/or between other portions of the FPGA, wherein the interconnect points comprise one or more pass transistors, wherein each pass transistor is equipped with a Dynamic Random Access Memory (DRAM) cell, the DRAM cell comprising a select transistor connected to a select line and to a data line, and wherein at least one of the select transistor and the pass transistor is located in the BEOL portion of the FPGA. The 'other portions of the FPGA' can be other functional blocks of the device apart from the logic block, such as input/output blocks, located in the FEOL portion of the device or not.

According to a preferred embodiment, the select transistor and/or the pass transistor located in the BEOL portion of the FPGA comprises source and drain electrodes, a gate electrode, a channel region and a gate dielectric region, and:

the source and drain electrodes of the transistor are metal lines or metal-filled interconnect vias located in a first metallization layer of the BEOL portion, the gate electrode is respectively a metal-filled interconnect via or a metal line of a second metallization layer of the BEOL portion, the second metallization layer being directly adjacent the first metallization layer, the channel region is a semiconductor layer on the source and drain electrodes, and the gate dielectric is a dielectric layer on the channel region, with the gate electrode being on the gate dielectric layer.

In an FPGA according to the latter embodiment, the semiconductor layer may be a layer of Indium Gallium Zinc Oxide (IGZO).

According to an embodiment, both the pass transistor and the select transistor are located in the BEOL portion of the FPGA. In the latter case, the select transistor and the pass transistor may be located in three subsequent metallization layers of the BEOL portion, wherein the middle of the three layers comprises the gate electrode of one of the transistors and the drain and source electrodes of the other of the transistors. Alternatively, the select transistor and the pass transistor may both be located in one pair of adjacent metallization layers of the BEOL portion.

The DRAM memory cell may further comprise a capacitor for storing the gate voltage of the pass transistor, the capacitor being equally located in the BEOL portion of the FPGA.

According to an embodiment, the capacitor comprises a bottom plate, a dielectric and a top plate, the bottom plate being formed by a metal line or an interconnect via in a first metallization layer of the BEOL portion of the FPGA, the top plate being formed respectively by an interconnect via or a metal line of a second metallization layer of the FPGA, the second metallization layer being directly adjacent to the first metallization layer, and the dielectric is placed between the bottom and top plate.

According to a further embodiment, the capacitor's top or bottom plate is formed by a metal filled interconnect via, or a metal line or any other type of conductor, that also forms the source or drain electrode of the select transistor.

BRIEF DESCRIPTION OF THE DRAWINGS

FIG. 1A illustrates a typical interconnect matrix in an FPGA device. FIG. 1B illustrates the detail of a typical programmable interconnect circuit.

FIG. 2 shows part of an interconnect circuit applicable in an FPGA according to an embodiment.

FIGS. 5A-5I show a process flow for producing a BEOL embedded transistor that is applicable in an FPGA device according to an embodiment.

DETAILED DESCRIPTION OF CERTAIN ILLUSTRATIVE EMBODIMENTS

Figure 3:
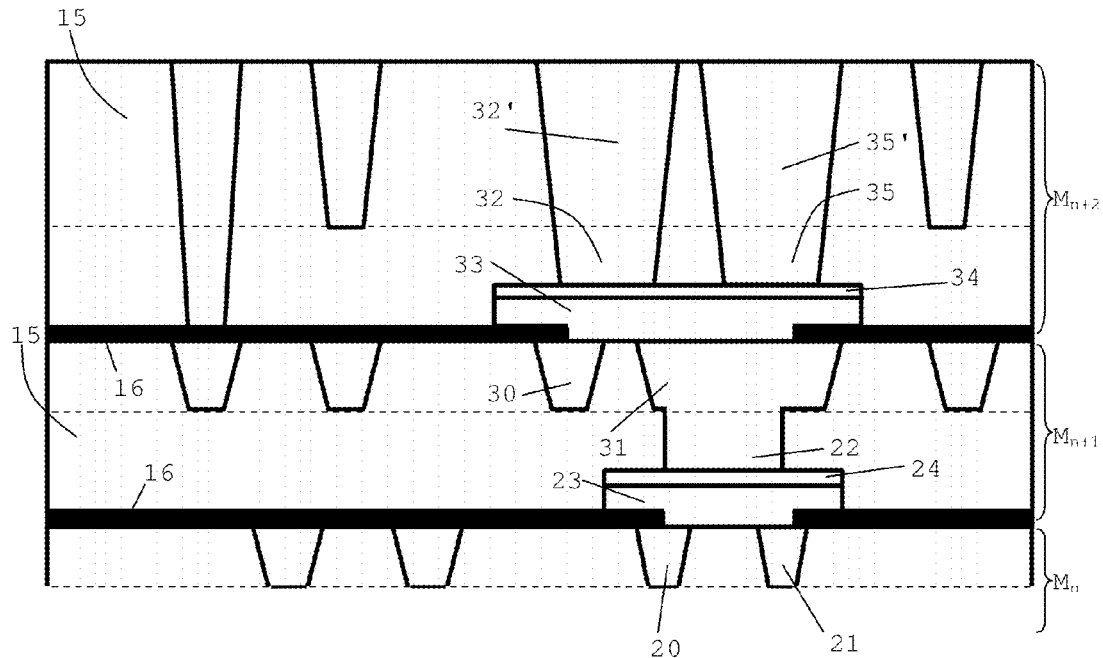
FIG. 3 shows how part of the interconnect circuit as depicted in FIG. 2 may be implemented within the BEOL portion of an FPGA device according to an embodiment.

In an FPGA device according to the embodiments, the programmable interconnect points for defining signal routing are equally provided in the form of the interconnect circuit shown in FIG. 1B (even though, as explained above, some points may comprise less than 6 pass transistors). However, at least some components of the interconnect circuit 5, and preferably all of the components are implemented during the Back End Of Line (BEOL) part of the FPGA's production process, i.e. the part where metal interconnect layers are produced on the semiconductor substrate. Hence, the components are located in the BEOL portion of the FPGA and not in the FPGA's Front End of Line portion (see definition further on). In this way, the overall area consumed on the semiconductor surface is drastically reduced. Furthermore, the memory element in an interconnect point is not a SRAM cell, but a Dynamic Random Access Memory cell (DRAM cell), requiring only a single select transistor and (preferably) a storage capacitor for each memory element, instead of the 6 transistors of the SRAM cell. The fabrication of the select transistor and/or the pass transistor and preferably also of the capacitor (if present) in the BEOL portion involves the use of a suitable thin film semiconductor layer enabling to produce transistors with low leakage embedded in the BEOL. A preferred choice for such thin film semiconductor material is Indium Gallium Zinc Oxide (hereafter referred to as IGZO). The term IGZO encompasses all realizable varieties of the compound $In_x Ga_y Zn_z O_w$ in terms of the values of the atomic numbers x,y,z and w, for example $In_2 Ga_2 ZnO_7$.

In the context of the present application, the FEOL portion and BEOL portion of an FPGA device are defined as follows. The FEOL portion comprises a processed semiconductor substrate, provided with a plurality of transistors and other devices, obtained by or obtainable by processing (e.g. STI, N+/P+ implants, gate deposition) a semiconductor wafer. The BEOL portion comprises a sequence of metallization layers for establishing electrical signal paths between the different parts of the FEOL portion and external terminals to which the FPGA is connected.

FIG. 2 illustrates a preferred circuit diagram of the DRAM memory cell connected to a pass transistor T1, for example the pass transistor between points 1 and 2 of FIG. 1B, in an FPGA according to the embodiments. The gate of T1 is connected to the drain of a select transistor T2. The gate of the select transistor T2 is connected to a select line 10, while the source of T2 is connected to a data line 11. Capacitor C1 is provided between the connection from T2 to T1 and a line 12 held at a reference voltage level $V_{ref}$. C1 is configured to store the gate voltage of T1 after programming or refresh of the DRAM cell. The operation of a DRAM cell as such via the data and select lines is known to a skilled person and therefore not explained here at length. According to a preferred embodiment, at least one of the above-named components, the select transistor T2 and the pass transistor T1 and preferably both transistors T1 and T2, as well as the capacitor C1 are produced in the BEOL portion of the FPGA, by depositing a thin film semiconductor material, and a gate dielectric layer and using the metal lines and metal-filled interconnect vias in the BEOL metallization layers as source, drain and gate electrodes. The term 'via' is known in the art (Vertical Interconnect Access), as a connection between metal lines in the BEOL.

FIG. 3 shows a possible way of implementing the memory cell of FIG. 2 in the BEOL portion of an FPGA according to the embodiments. Three metallization layers $M_n$, $M_{n+1}$ and $M_{n+3}$ are shown. These layers may be anywhere in the BEOL stack. Each metallization layer has an upper level (above the dotted lines) comprising a network of metal lines running in the plane of the layer and a lower level (under the dotted line), comprising metal-filled via interconnects, connecting the metal lines to the underlying metallization layer. For layer $M_n$, only the upper level is shown. The metal lines and via interconnects are embedded in layers 15 of intermetal dielectric (IMD) material, e.g. $SiO_2$. Additional layers 16 of a dielectric material (e.g. SiCN) are preferably present between the metallization layers. These layers 16 may have one or more functions, for example the functions of a passivation layer, etch stop layer or diffusion barrier. The pass transistor T1 is implemented on top of metallization layer $M_n$ and in between the metallization layers $M_n$ and $M_{n+1}$: the source and drain electrodes are formed by metal lines 20 and 21 in $M_n$, and the gate electrode is formed by the via interconnect 22. The channel is formed by a layer 23 of IGZO or another suitable thin film semiconductor layer, while the gate dielectric is formed by a layer 24 of $Al_2O_3$ or any other material or stack of materials qualifying as a high quality gate dielectric. The select transistor T2 is implemented on top of metallization layer $M_{n+1}$ in between the metallization layers $M_{n+1}$ and $M_{n+2}$: source and drain electrodes are respectively formed by metal lines 30 and 31 in $M_{+1}$, while the gate electrode is formed by the metal filled interconnect via 32 in $M_{n+2}$, which is connected to the metal line 32' in $M_{n+2}$, which forms or is connected to the select line 10 (see FIG. 2). The channel and gate oxide of the select transistor T2 are formed by layers 33/34 of thin film semiconductor and gate dielectric respectively. Metal line 31 can be broader than the other metal lines in the layer $M_{n+1}$. This broader metal line 31 and the $IGZO/Al_2O_3$ stack at the same time form the bottom plate and dielectric respectively of the capacitor C1, with the top plate of C1 formed by via interconnect 35, connected to metal line 35', which is in turn connected to reference voltage Vref (line 12 in FIG. 2). The metal line 30 in $M_{n+1}$ forms or is connected to the data line (line 11 in FIG. 2).

In the embodiment shown, the top plate of the capacitor C1 is a called via interconnect 35, even though it does not 'interconnect' through the full intermetal dielectric 15 to contact the lower metallization level, as a normal via would. As there is dielectric layer (2,34,55 or 56) deposited underneath the via interconnect 35, the via interconnect 35 stops at the dielectric layer. The same is true of the gate electrodes 22/32/62 formed by interconnect vias. In defining the scope of the embodiments and the appended claims, the term 'interconnect via' comprises any conductor obtainable by standard processing steps for producing actual interconnect vias in the BEOL, also when these interconnect vias are interrupted by a dielectric layer. The top plate of the capacitor C1 may be referred to more generally as a 'conductor plate' and could be produced to have a larger area than a standard interconnect via, if a larger capacitance is required than would be obtainable with standard interconnect via sizes and a particular dielectric layer 34.

Figure 4:
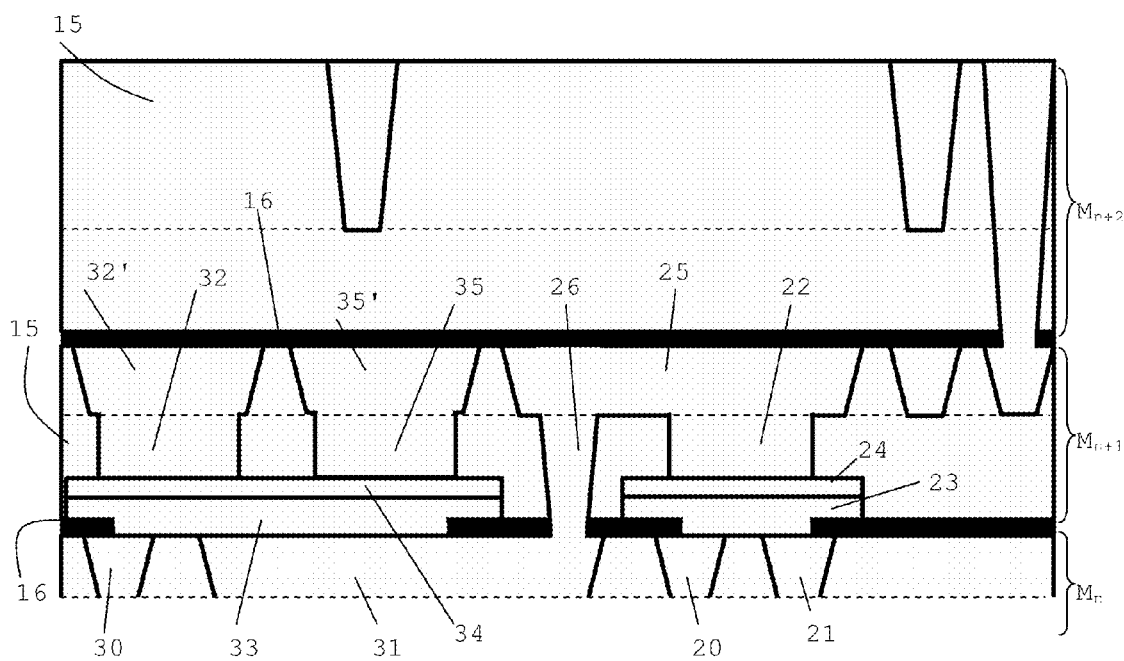
FIG. 4 shows an alternative implementation of part of the interconnect circuit as depicted in FIG. 2.
Figure 5F:
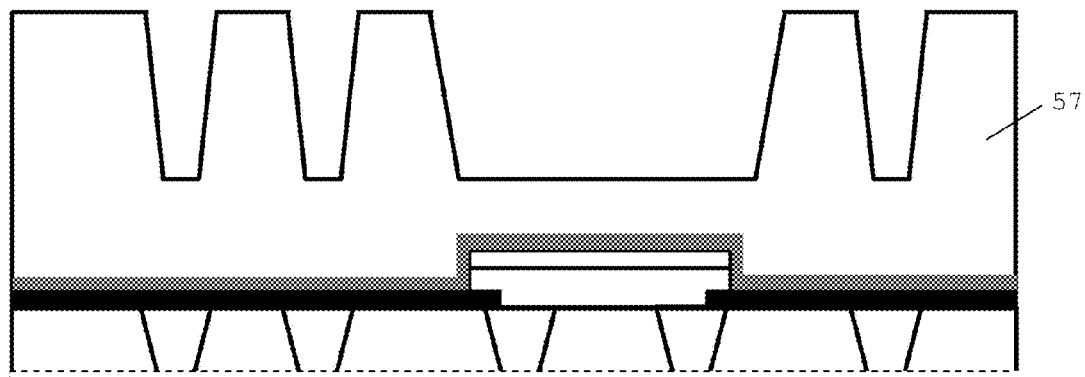
Figure 5G:
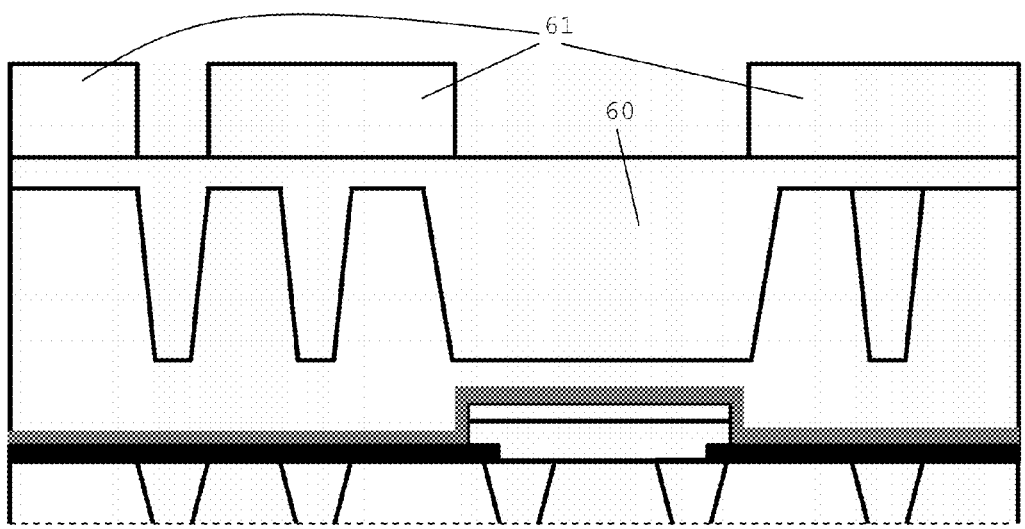
Figure 5H:
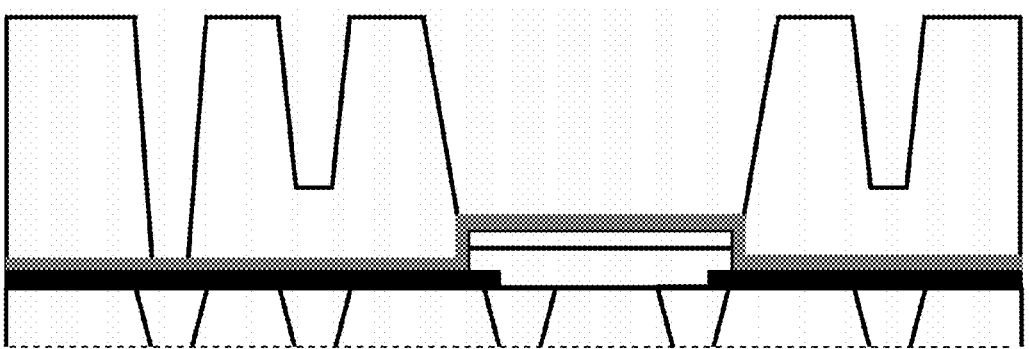
Figure 5I:
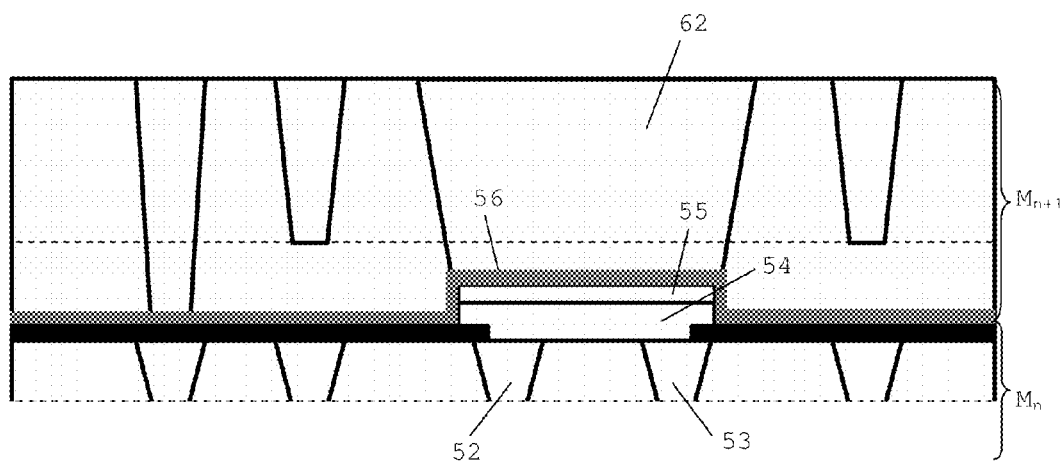

Other configurations are possible. Both the T1 and T2 transistors may be produced embedded on metallization layer $M_n$ and in between two adjacent metallization layers $M_n$ and $M_{n+1}$, as illustrated in FIG. 4. The structure of the select transistor T2 and the capacitor C1 is the same as in the embodiment of FIG. 3, indicated by the same numerical references for source and drain electrodes 30/31, gate electrode 32, IGZO layer and gate dielectric layer 33/34. The pass transistor T1 equally has source and drain electrodes 20/21 formed by metal lines in $M_n$ and a gate electrode 22 formed by metal filled via interconnect 22 as in the previous embodiment, but with source, drain and gate electrodes of T1 and T2 now located in one pair of adjacent metallization layers $M_n$ and $M_{n+1}$. The connection from the pass transistor's gate electrode 22 to the metal line 31 that forms the bottom plate of the capacitor and the drain electrode of the select transistor T2 is now made through metal line 25 and via interconnect 26. This embodiment has the advantage of requiring only a single deposition of IGZO and gate dielectric, but on the other hand requires additional area due to the lateral connection from T1 to T2 through the via 26.

In both of the embodiments illustrated in FIGS. 3 and 4, additional layers may be present apart from the ones shown. For example, an additional dielectric layer may be present between the transistors' gate electrodes 22/32 and the capacitor's top plate 35 on the one hand and the gate dielectric 24/34 on the other hand. The layer may be necessary during the processing, to act as an etch stop layer during etching of the openings into which copper is to be deposited for forming the metal lines and vias (see further where a description is given of a possible process sequence).

According to an embodiment, the capacitor C1 is omitted, and the charge is stored in the pass transistor T1 itself. This is possible provided that the gate dielectric of the pass transistor is sufficiently large in surface area, so that the inherent capacity of the pass transistor is important enough to retain the gate voltage of the pass transistor for the time required.

A process sequence for producing a transistor between two BEOL metallization layers is illustrated in FIG. 5. FIG. 5A shows the upper level of a first metallization layer $M_n$, comprising a number of metal lines 48, the intermetal dielectric 49 (this can be for example low K material, $SiO_2$ or air gap) and a passivation layer 50, e.g. a layer of SiCN. An opening 51 is etched in the passivation layer 50 by known litho/etch steps. The opening exposes at least a portion of two metal lines 52/53 in the $M_n$ layer. After that, layers of IGZO and $Al_2O_3$ 54/55 are sequentially deposited by a suitable deposition technique (FIG. 5C). For example, a layer of between 10 nm and 50 nm of IGZO is deposited by PVD (Physical Vapour Deposition) and a layer of between 10 nm and 50 nm of $Al_2O_3$ is deposited on and in contact with the IGZO by ALD (Atomic Layer Deposition). Suitable conditions for the PVD and ALD processes are known to the skilled reader and not described here in detail. A patterning of the $IGZO/Al_2O_3$ stack is then performed, to obtain the stack 54/55 only on the required location (FIG. 5D). An additional dielectric layer 56, for example a SiCN layer is deposited over the complete surface, covering the stack 56. This layer will act as etch stop layer during subsequent etching steps. Then the intermetal dielectric layer 57 of the next metallization layer $M_{n+1}$ is deposited, followed by deposition of a Bottom Anti-Reflective Coating (BARC) layer 58, in turn followed by the deposition and patterning of a resist layer 59 (FIG. 5E). Through the patterned resist layer, the IMD layer 57 is etched a first time for forming trenches destined to be filled by metal lines in the upper level of $M_{n+1}$ (FIG. 5F), after which a second BARC 60 and resist 61 are deposited and the second resist is patterned, after which a second etching step is done, to form openings destined to be filled by interconnect vias in the lower level of $M_{n+1}$ (FIGS. 5G and 5H). Etching of the vias stops on the etch stop layer 56. If the layer 55 can act as an etch stop layer, layer 56 may be omitted from the process. Vice versa, if layer 56 is a sufficiently good gate dielectric material, layer 55 could be omitted from the process (or layers 24/34 could be omitted from the devices of FIGS. 3 and 4, and replaced by an etch stop layer). Metal deposition, preferably deposition of a seed layer and electrodeposition of copper, into the patterned trenches and vias is performed for forming all metal lines and interconnects, including the transistor gate electrode 62 on top of the $IGZO/Al_2O_3$/SiCN stack (FIG. 5I). The described method step sequence does not exclude the presence of other method steps in between the steps of the sequence. Method steps that are routinely applied during BEOL processing have not been included in the above description for the sake of conciseness. For example, diffusion barrier layers will need to be deposited prior to deposition of metal lines and interconnect vias. In particular, in between the Cu metallization and the IGZO, a conductive layer is required that works as a diffusion barrier to the Cu. This can be e.g. a layer of Co, TaN, TiN.

The thin film semiconductor material that is applicable in an FPGA according to the embodiments must be suitable for producing a low leakage select transistor T2, so that the memory cell can be used as a DRAM cell. The thin film semiconductor layer is furthermore a layer that can be deposited, for example by PVD, CVD, ALD, solution deposition, on an amorphous substrate, i.e. it does not require a crystalline template. The thin film semiconductor must also be compatible with the thermal budget of BEOL processing, i.e. the material must not degrade at the temperatures used in the BEOL part of the FPGA's production process (typically 350-380° C.). IGZO is a preferred option for the thin film semiconductor, but other materials may be possible, such as amorphous silicon, monocrystalline or polycrystalline silicon, graphene, Carbon nano tubes or metal oxides other than IGZO, e.g. ZnO, HfInZnO, SnO, CuO.

In the embodiments of FIGS. 3 and 4, the gate electrodes 22/32 of T1 and T2 are metal-filled interconnect vias at the top of the transistors T1/T2 while the source and drain electrodes (20/21 for T1 and 30/31 for T2) are metal lines at the bottom of the transistors. This is the preferred embodiment, given that the signal for selecting the pass transistor arrives from outside the FPGA, i.e. from the upper metallization levels. However, the embodiments do not exclude the inverse embodiment, wherein both the T1 and T2 transistors have the gate electrode formed by a metal line at the bottom of the transistor, in a first metallization layer, and the source and drain electrodes formed by a pair of interconnect vias at the top of transistor, in a second metallization layer on top of the first (the first and second metallization layers being not necessarily the same for T1 and T2).

The embodiments do not exclude that only one of the transistors T1 and T2 is located in the BEOL portion of the FPGA. In that case the other transistor would still be located in the FEOL portion, while the electrical connection between the two is established through a suitable design of via connections and metal lines in the metallization layers that are present between the BEOL transistor and the FEOL transistor.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

Unless specifically specified, the description of a layer being present, deposited or produced 'on' another layer or substrate, includes the options of
    the layer being present, produced or deposited directly on, i.e. in physical contact with, the other layer or substrate, and
    the layer being present, produced or deposited on one or a stack of intermediate layers between the layer and the other layer or substrate.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A field programmable gate array device, comprising: a front-end-of-line portion comprising a plurality of logic blocks; a back-end-of-line portion comprising a plurality of metallization layers; and programmable interconnect points configured to define signal routing between the logic blocks and/or between other portions of the field programmable gate array device, wherein the interconnect points comprise one or more pass transistors, wherein each pass transistor is equipped with a dynamic random access memory cell, the dynamic random access memory cell comprising a select transistor connected to a select line and to a data line, and wherein the select transistor and/or the pass transistor is located in the back-end-of-line portion of the field programmable gate array device; wherein both the pass transistor and the select transistor are located in the back-end-of-line portion of the field programmable gate array device.

2. The field programmable gate array device of claim 1, wherein the select transistor and/or the pass transistor located in the back-end-of-line portion of the field programmable gate array device comprises source and drain electrodes, a gate electrode, a channel region, and a gate dielectric region, and wherein:

the source and drain electrodes of the transistor are metal lines or metal-filled interconnect vias located in a first metallization layer of the back-end-of-line portion,
the gate electrode is a metal-filled interconnect via or a metal line of a second metallization layer of the a back-end-of-line portion, the second metallization layer being directly adjacent the first metallization layer,
the channel region is a semiconductor layer on the source and drain electrodes, and
the gate dielectric is a dielectric layer on the channel region, with the gate electrode being on the gate dielectric layer.

3. The field programmable gate array device of claim 2, wherein the semiconductor layer is a layer of indium gallium zinc oxide.

4. The field programmable gate array device of claim 1, wherein the select transistor and the pass transistor are located in three subsequent metallization layers of the back-end-of-line portion, wherein a middle of the three subsequent metallization layers comprises the gate electrode of one of the transistors and the drain and source electrodes of another of the transistors.

5. The field programmable gate array device of claim 1, wherein the select transistor and the pass transistor are both located in one pair of adjacent metallization layers in the three subsequent metallization layer of the back-end-of-line portion.

6. The field programmable gate array device of claim 1, wherein the dynamic random access memory cell further comprises a capacitor configured to store a gate voltage of the pass transistor, the capacitor being equally located in the back-end-of-line portion of the field programmable gate array device.

7. The field programmable gate array device of claim 6, wherein the capacitor comprises a bottom plate, a dielectric and a top plate, the bottom plate being formed by a metal line or an interconnect via in a first metallization layer of the back-end-of-line portion of the field programmable gate array device, the top plate being formed by an interconnect via or a metal line of a second metallization layer of the field programmable gate array device, the second metallization layer being directly adjacent to the first metallization layer, and wherein the dielectric is placed between the bottom and top plate.

8. The field programmable gate array device of claim 6, wherein the capacitor's top or bottom plate is formed by a metal filled interconnect via, or a metal line or any other type of conductor, that also forms the source or drain electrode of the select transistor.

* * * * *

UNITED STATES PATENT AND TRADEMARK OFFICE
CERTIFICATE OF CORRECTION

PATENT NO. : 9,553,586 B2
APPLICATION NO. : 14/565316
DATED : January 24, 2017
INVENTOR(S) : Genoe et al.

Page 1 of 1

It is certified that error appears in the above-identified patent and that said Letters Patent is hereby corrected as shown below:

On the Title Page

Page 1 (item (54), Title) at Line 1, Change "FILED" to --FIELD--.

In the Specification

In Column 1 at Line 1, Change "FILED" to --FIELD--.

In Column 4 at Line 13, Change "$M_{n+3}$" to --$M_{n+2}$--.

In Column 4 at Line 38, Change "$M_{+1}$," to --$M_{n+1}$,--.

In the Claims

In Column 10 at Line 5, In Claim 2, change "the a" to --a--.

Signed and Sealed this
Sixteenth Day of May, 2017

Michelle K. Lee
*Director of the United States Patent and Trademark Office*